US005691102A

United States Patent [19]

Ando

[11] Patent Number: 5,691,102

[45] Date of Patent: Nov. 25, 1997

[54] PROCESS OF PRODUCING INK-OOZING PLATE FOR A STAMP

[75] Inventor: Yoichi Ando, Sagamihara, Japan

[73] Assignee: Mitsubishi Pencil Kabushiki Kaisha, Tokyo, Japan

[21] Appl. No.: 594,952

[22] Filed: Jan. 31, 1996

[30] Foreign Application Priority Data

Feb. 3, 1995 [JP] Japan .................................... 7-017357

[51] Int. Cl.[6] ........................................................ G03F 7/00

[52] U.S. Cl. .......................... 430/200; 430/306; 430/944; 430/964

[58] Field of Search .................................... 430/306, 320, 430/199, 200, 202, 204, 205, 944, 964

[56] References Cited

U.S. PATENT DOCUMENTS 3,742,853 7/1973 Landsman ............................... 430/306
4,064,205 12/1977 Landsman ............................... 430/200

FOREIGN PATENT DOCUMENTS 49-7003 1/1974 Japan .
50-155323 12/1975 Japan .
51-95469 8/1976 Japan .
52-71710 5/1977 Japan .
57-136652 8/1982 Japan .
60-193686 10/1985 Japan .
3-96383 4/1991 Japan .
6-155698 6/1994 Japan .

*Primary Examiner*—John A. McPherson
*Attorney, Agent, or Firm*—Darby & Darby

[57] ABSTRACT

A process of producing an ink-oozing plate for a stamp having open cells, in which the production steps and the apparatus are simple, and an ink-oozing plate for a stamp which can provide a sharp impress image and is conveniently used, including such a method as using an exothermally fusible sheet coated with a heat-fusing substance which generates heat by irradiating with infrared rays and can penetrate into a stamp material, irradiating with infrared rays while pressing the stamp material, and coating an impress image copy with a liquid substance containing water, and thus coming to complete the process of producing the ink-oozing plate for a stamp of the present invention.

3 Claims, 2 Drawing Sheets

PROCESS OF PRODUCING INK-OOZING PLATE FOR A STAMP

BACKGROUND OF THE INVENTION

1. Field of the Invention

The present invention relates to a process of producing an ink-oozing plate for a stamp, more specifically to an improvement in a process of producing an ink-oozing plate for a stamp comprising a sponge material having open cells, wherein stamping can be repeated without supplying stamp ink for a long time by impregnating a stamp material in advance with a stamp ink.

2. Description of the Related Art

Known is a stamp in which a stamp material comprises sponge rubber having open cells and stamp ink is occluded in advance in the sponge rubber in order to save time for applying a stamp ink on a printing face every time a stamping plate or a stamp is affixed. A process of producing the stamp described above is disclosed in Japanese Patent Application Laid-Open No. Sho 60-193686, in which the whole part of a sponge surface excluding a part where an impress image is formed is caused to subside concavewise by a heating embossing processing to harden it by pressing, and a convex part is turned into an impress image-forming part which functions as a stamp ink occluding part, and a method in which a porous matter is adhered by pressing on a similar heated plate is disclosed as well in Japanese Patent Application Laid-Open No. Sho 50-155323. However, these methods require molds which serve as heating plates and labor for engraving or etching characters, marks and figures thereon.

Further, processes of producing stamping plates are disclosed in Japanese Patent Application Laid-Open No. Sho 57-136652 and Japanese Patent Application Laid-Open No. Sho 49-7003, wherein a photopolymerizable liquid resin is applied on the surface of a stamp material; a positive film is put on the top face thereof, and UV rays are applied from the upper part to cause a photopolymerization reaction; and then, an unreacted resin is removed by rinsing to expose the surface of the stamp material from the removed part. Also, a planographic stamp prepared by the similar method using a negative film is disclosed in Japanese Utility Model Application Laid-Open No. Sho 52-71710. However, these methods have complex steps such as a preparation of a negative or positive film, coating of resins, photopolymerization, and rinsing, and therefore production processes by which desired stamps can be quickly provided are expected. That is, a process of producing a stamping plate in which a stamping plate can be produced with a small flash light irradiating energy and the steps are simple is expected.

The following is disclosed in Japanese Patent Application Laid-Open No. Hei 3-96383. That is, "an engraving original subjected to plate making is laminated and adhered closely on the surface of a porous material, and a clogging resin as means of preventing from passing stamp ink is put on the surface of this engraving original to print with a squeegee. This clogging resin passes through an image aperture part on the engraving original and is impregnated into the surface of the porous material in a shape corresponding to the image aperture part to clog porers at this part. After this clogging resin is cured, stamp ink is impregnated all over the porous material, whereby it can be used as a stamp".

As described above, conventional processes of producing ink-oozing plate for a stamp having open cells require much time and can not provide sharp impress images.

Accordingly, a production process which can quickly provide a desired stamp having a sharp impress image is desired.

SUMMARY OF THE INVENTION

An object of the present invention is to solve the problems described above and to provide a process of producing an ink-oozing plate for a stamp having open cells, in which the production steps and the apparatus are simple, and an ink-oozing plate for a stamp which can provide a sharp impress image and is conveniently used.

Investigations repeated intensively by the present inventors in order to achieve the objects described above have resulted in finding such a method as using an exothermally fusible sheet coated with a heat-fusing substance which generates heat by irradiating with infrared rays and can penetrate into a stamp material, irradiating with infrared rays while pressing the stamp material, and coating an impress image copy with a liquid substance containing water, and thus coming to complete the process of producing the ink-oozing plate for a stamp of the present invention.

That is, the process of producing the ink-oozing plate for a stamp of the present invention is characterized in comprising:

superposing an exothermally fusible sheet comprising an infrared ray-transmittable film coated thereon with a heat-fusing substance which is heated by irradiating with infrared rays to melt at temperatures higher than a melt temperature of an elastic resin-made stamp material having stamp ink-impregnable open cells, to a thickness of 0.5 to 10μ, on the surface of the stamp material so that the above heat-fusing substance contacts the surface of the stamp material;

superposing thereon a desired impress image copy so that it becomes a mirror image;

irradiating with a flash containing infrared rays from the upper part of the copy while compressing the stamp material by 5 to 70% to allow the infrared rays to be transmitted through a copy image-absent part on the impress image copy and cause the infrared rays reaching the exothermally fusible sheet to heat and melt the heat-fusing substance present on a part corresponding to the above copy image-absent part;

causing this heated heat-fusing substance to penetrate into the stamp material and melt the surface layer of the stamp material to form a penetrating molten part (a stamp ink-non-oozing part) where the open cells are blocked, and allowing the copy image part on the impress image copy to cut off or absorb the infrared rays to cause no heat-fusing substance present on the part of the exothermally fusible sheet corresponding thereto to be heated and molten, which does not lead to blocking the cells present on the surface of the corresponding stamp material, to form a non-molten part (a stamp ink-oozing part) to thereby form a concave part in which the penetrating molten part is lower by 0.01 mm or more than the non-molten part of the stamp material.

The preferred stamp material is a sheet with a thickness of 0.5 to 30 mm comprising polyolefin series foam in which the melt temperature is 50° to 150° C. and which has fine open cells having a cross-linked network structure and an average pore diameter of 2 to 10μ, and a porosity of 30 to 80%. The preferred exothermally fusible sheet is prepared by coating an infrared ray-transmittable sheet with the heat-fusing substance containing at least carbon or a high polymer and having a melt temperature of 50° to 200° C. and a melt viscosity of 50 to 2000 mPa.s. Further, the impress image copy is preferably coated with a liquid substance.

The ink-oozing plate for a stamp of the present invention is characterized in having a stamp ink-impregnated part comprising an elastic resin-made stamp material having stamp ink-impregnaable open cells, and a printing face comprising a stamp ink-oozing part formed on the surface of the above stamp material and a stamp ink-non-oozing part comprising a concave part formed so that it is 0.01 mm or more lower than the above stamp ink-oozing part, wherein the above stamp ink-non-oozing part comprises a penetrating molten-mixing part where a heat-fusing substance-penetrating part and a stamp material-molten part are present together, and a stamp material-molten part.

The stamp material comprises preferably a polyolefin series foam sheet having a melt temperature of 50° to 150° C., an average pore diameter of 2 to 10μ, a porosity of 30 to 80%, and a thickness of 0.5 to 30 mm. The stamp material has preferably a length of 5 to 500 mm and a width of 5 to 200 mm.

DESCRIPTION OF THE MARKS

Figure 1A:
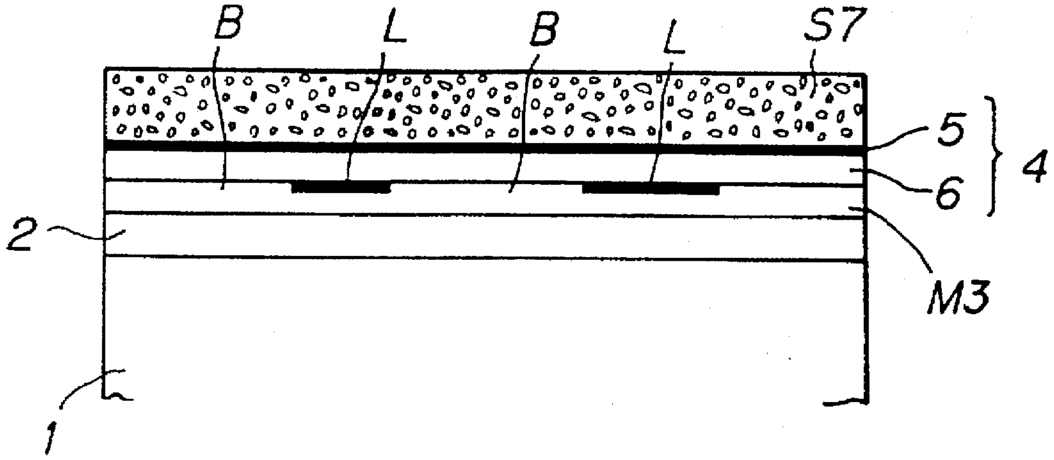
FIG. 1 is a schematic drawing for producing a stamping plate of the present invention, wherein the conditions of the heat-fusing sheet and the stamp material (a) before irradiating with a flash and (b) after irradiating with the flash are schematically shown.

1 Flashlight emitting part
2 Glass plate
M3 Impress image copy
4 Exothermally fusible sheet
5 Heat-fusing substance
6 Acetate film
S7 Stamp material (foamed polyethylene sheet)
L Impress copy image
B Impress copy image-absent part
11 Penetrating molten-mixing part (a heat-fusing substance-penetrating part and a stamp material molten part are present together)
12 Stamp material molten part
H Penetrating molten part (stamp ink-non-oozing part)
I Non-molten part (stamp ink-oozing part)

DETAILED DESCRIPTION OF PREFERRED EMBODIMENTS

The stamp material used in the process of producing the ink-oozing plate for a stamp (that is a stamping plate) of the present invention and having stamp ink-impregnable open cells may be of any material as far as it is an open cells material having an excellent self-holding ability of the stamp ink, and includes, for example, sponge rubber of natural rubber, and synthetic rubber series sponge rubber, and a foamed synthetic resin. Preferably used is a sheet with a thickness of 0.5 to 30 mm (more preferably 0.5 to 10 mm) comprising a polyolefin series foam in which a melt temperature is 50° to 150° C. and which has fine open cells having an average pore diameter of 2 to 10μ, and a porosity of 30 to 80%.

In irradiating with a flash containing infrared rays in the production process of the present invention, a flash the light source of which is a xenon flash device, a photostrobo flash, or flash bulb.

The exothermally fusible sheet used in the production process of the present invention comprises an infrared ray-transmittable film coated with heat-fusing resin solution and the like containing carbon black or a high polymer substance which is at least heated by irradiation with infrared rays or is prepared by coating a film with a heat-fusing substance solution prepared by dissolving a substance which is heated with infrared rays in a hot melt resin or an organic solvent.

To be concrete, the exothermally fusible sheet is prepared by hot melt-coating an acetate film with a heat-fusing substance comprising wax, a resin and carbon black to a thickness of 0.5 to 10μ. The heat-fusing substance has a melting point of 50° to 160° C. which is higher than the melt temperature of a stamp material, and is blended so that the melt viscosity thereof becomes 50 to 2000 mPa.s.

The heat-fusing substance coated on the exothermally fusible sheet used in the present invention has a thickness of 0.5 to 10μ, preferably 2 to 5μ, and more preferably 4 to 5μ.

The thickness of the heat-fusing substance coated on the exothermally fusible sheet is an important element for infrared rays-irradiating conditions, and if it is too thin, the effect of blocking cells by the penetration of the above heat-fusing substance can not be expected. If it is too thick, not only excess flash irradiating energy is required, but also the molten heat-fusing substance can not sufficiently penetrate into cells to roughen the surface of the stamp material, or the cells are not blocked, and a level difference from a non-molten part where no cells are blocked is reversed, which leads to a stamping plate incapable of being used for stamping. The too large thickness provides the defects that the coating thereof is difficult and that the heat-fusing substance is liable to peel off from the film, and therefore handling is inferior.

An acetate film having a high transmittance of infrared rays is preferred as the infrared rays-transmittable film, and the thinner the thickness thereof is, the better the efficiency of flash irradiating energy is. However, since the film and the stamp material are adhered via the heat-fusing substance, they have to be separated after irradiating with the flash, and the film has preferably a thickness of 10μ or more so that the film is not damaged in such case.

A copy prepared by cutting out a sheet which cuts off infrared rays and is not heated therewith in the form of an impress copy image is the best as the impress image copy used in the production process of the present invention, and the second best is a copy prepared by forming an image on a transparent film which is not heated with infrared rays and has a good transmittance with recording material such as ink, toner and the like which does not transmit infrared rays and is not heated therewith. That is, it includes a copy prepared by drawing characters, marks and figures on a paper or a film with recording material. It is preferred in principle that a paper or a film has a high transmittance of infrared rays and that drawings such as characters, marks and figures are drawn with recording material which reflect infrared rays.

In the production process of the present invention, impress image copies produced with a PPC copying machine are preferably used as a standard to produce the best impress image copy.

At present, PPC copying machines can freely be available at enterprises, schools and convenience stores, and therefore the best impress image copies can simply be produced without mistakes even by general users having many restrictions.

An impress image copy prepared by using this PPC copying machine is a copy in which characters, marks and figures are drawn with toners by copying a desired original copy with a PPC copying machine.

A significant difference in performances in terms of an absorptance of infrared rays is not observed between various toners which are commercially available in the market, but it is observed between the thicknesses of papers which vary widely depending on copying machines. An impress image copy produced by copying on a PPC copying paper with a PPC copying machine can be coated with a liquid substance to enhance a transmittance of infrared rays in a PPC copying paper and offset a scattering in the thicknesses of papers, whereby the transmittance of infrared rays can be almost uniformized. This method is not restricted to a copied manuscript and can be applied as well to copies written on the similar papers with writing tools such as pencil and sign pen and copies outputted from printers.

The liquid substance includes a liquid prepared by adding 20 to 50% of alcohols to water. In this case, alcohol is an auxiliary for assisting water to penetrate into paper. The liquid substance is not restricted to alcohols, and the same effect can be provided even only with water, though it takes time to penetrate. In this connection, the liquid coated on an impress image copy is not restricted to water, and a substance which penetrates into paper and has the same heat conductivity as that of water can reveal the same performance. In a different case from this, the reproducibility of fine lines can be inferior but it remains unchanged that a flash irradiating energy can be saved to a large extent (if the liquid is water, even when heat is generated on a copy image, the heat is hard to be transmitted to an exothermally fusible sheet, and therefore a sharp impress image can be obtained).

The liquid substance is used for PPC copying paper and manuscript paper in order to enhance an infrared ray transmittance (transparency) of paper itself, and to restrain the recording material from its heat generation.

In production process of a stamping plate of the present invention, an exothermally fusible sheet provided thereon with a heat-fusing substance in a thickness of 0.5 to 10μ is superposed on the surface of a stamp material so that the heat-fusing substance contacts the stamp material, and an impress image copy coated with a liquid substance containing at least water is superposed thereon so that the impress image copy is turned into a mirror image; and a flash containing infrared rays is irradiated from the upper part of the above copy while compressing the above stamp material by 5 to 70%, that is into about 90 to 30% of stamp material in thickness, whereby a penetrating molten part (a stamp ink-non-oozing part) and a non-penetrating molten part (a stamp ink-oozing part) are formed to obtain the ink-oozing plate for stamp.

Infrared rays are transmitted through the impress image copy at a part other than the impress copy image in the above impress image copy to reach the exothermally fusible sheet and heats and melts the heat-fusing substance. Since the above heat-fusing substance has a higher melting temperature than that of the stamp material, the heat-fusing substance penetrates into the surface layer of the stamp material, and at the same time, the surface layer of the stamp material can be molten with the heat of the above heat-fusing substance. Cells are compressed by compressing the stamp material, and this as well as the melting of a stamp material surface layer expedites the blocking of the cells.

This compression can save an irradiating energy of a flash.

The penetrating molten part (stamp ink-non-oozing part) in the present invention is characterized in that it contains a penetrating molten mixing part where a heat-fusing substance-penetrating part and a stamp material molten part are present together. Since in the case where only a heat-fusing substance part is present and a heat-fusing substance-penetrating part and a stamp material molten part are absent, the layer thickness of the heat-fusing substance part has to be thickened, more flash irradiating energy than that in the production process of the present invention is required, which is uneconomical. That is, the production process of the present invention not only is economical since a stamp ink-non-infiltrated part is formed with less flash irradiating energy, but also since a thermal influence to the other stamp ink-infiltrated part is reduced, the reproduction of a fine impress copy image becomes possible, and a sharp impress image can be obtained.

Since the heat-fusing substance has a higher melting temperature than that of the stamp material, the irradiation with a flash while compressing the stamp material drives the stamp material itself into a close contact state that no cells are present, and melts the stamp material. Accordingly, the cells in plural layers are blocked to form the penetrating molten mixing part.

Accordingly, in the case where the stamp ink-non-oozing part is formed only with the heat-fusing substance part, the layer thickness of the heat-fusing substance present on the exothermally fusible sheet has to be thickened. In the production process of the present invention, however, a performance as the stamp ink-non-oozing part can be obtained even with the thinner layer thickness of the exothermally fusible sheet, and a flash irradiating energy can be therefore reduced.

A stamp material surface having a high smoothness can reduce the compression described above and save a flash irradiating energy, whereby an excellent impress image can be obtained.

The stamp material used in the present invention has a cell diameter of 2 to 10μ, preferably 3 to 5μ. Since the larger cell diameter requires a larger flash irradiating energy for blocking cells, and this provides the trouble that cells in unnecessary parts are blocked as well. On the other hand, the smaller cell diameter blocks cells in unnecessary parts even with a slight increase in the flash irradiating energy, and it is therefore difficult to adjust irradiating energy.

A level difference between the penetrating molten part and the penetrating non-molten part in the stamping plate obtained by compressing the stamp material described above by 5 to 70% by the preceding method is 0.01 mm or more, preferably 0.05 to 0.1 mm.

In the present invention, when a stamping plate is produced with, for example, the stamp material (30 mm×50 mm×1.6 mm) having a cell diameter of about 3μ so that a level difference between the penetrating molten part and the penetrating non-molten part becomes about 0.01 mm, a stamp into which about 2 g of stamp ink having an ink viscosity of about 1000 mPa.s can be filled and which causes no stain on a paper surface in a non-oozing part in stamping and has a long life can be obtained.

However, when a stamping plate is produced at the same energy level so that the above level difference becomes about 0.01 mm or less in the condition that this heat-fusing substance is not present, only about 0.2 g of the stamp substance can be filled.

The ink-oozing plate for a stamp obtained by the production process of the present invention has the advantage that it functions as a stamp without combining with other members, but the stamping plate can be installed on a mount to prepare an ordinary stamp. In the use thereof, stamp ink is impregnated or occluded in advance into the stamping plate, whereby a sharp impress image can be repeatedly obtained without supplementing the stamp ink over the long period of time. The stamp ink occluded into a stamp, which is not volatile at room temperatures and has a viscosity of 100~3,500 mPa.s, reveals a preferred stamping performance. In particular, the stamp ink having a viscosity of 500 to 1,500 mPa.s is preferred in terms of easiness in filling into a stamping plate and a stamp ink oozing amount in stamping.

A stamp ink-occluding member having a higher foaming degree than that of a stamp material of a stamping plate can be provided between the stamping plate and a mount to extend a stamping life and facilitate the supplement of the stamp ink.

The ink-oozing plate for a stamp of the present invention is installed on a roll surface to make continuous printing possible by rotating the roll.

Since the process of producing the ink-oozing plate for a stamp of the present invention has simple steps and does not need a mold, it can rapidly provide a stamp which meets objects and has a high grade.

The transmitting efficiency of infrared rays is improved by coating an impress image copy with a liquid containing water, and a stable ink-oozing plate for a stamp can be obtained even if the thicknesses of the impress image copies would be dispersed. Further, since compressing the stamp material in irradiating with a flash not only causes the heat-fusing substance to penetrate but also melts the stamp material while compressing the cells, the cells are completely blocked, and the distinct penetrating molten part (that is, the stamp ink-non-oozing part) is formed, whereby a sharp impress image can be obtained.

EXAMPLE

The example of the present invention will be explained below with reference to the drawings.

Production of an Impress Image Copy

A printed matter was copied with a PPC copying machine to prepare an impress image copy 3 having an impress copy image L.

Production of a Stamping Plate

An impress copy image L on an impress image copy M3 is superposed on a transparent glass plate 2 of a xenon flash emitting device 1 having an emitting energy of 50 joules so that the impress copy image L becomes an ordinary image. After coating this impress image copy M3 with a liquid substance (an ethyl alcohol 50 volume % aqueous solution), an exothermally fusible sheet 4 is further superposed thereon with a heat-fusing substance face 5 turned upward, and a stamp material (foamed polyethylene sheet) S7 which has fine open cells of 3μ having a cross-linked network structure and which has a porosity of 60%, a melt temperature of about 70° C. and a thickness of 1.6 mm is superposed thereon [refer to FIG. 1(*a*)].

The exothermally fusible sheet 4 used here was prepared by coating an acetate film 6 (thickness: 20 μm) with a heat-fusing substance 5 (having a melt temperature of 80° C. and a melt viscosity of 100 mPa.s) comprising wax, a resin and carbon black to a thickness of 3 μm. The lower the viscosity of the heat-fusing substance is, the more easily the heat-fusing substance penetrates. Accordingly, the heat-fusing substance having a lower viscosity is preferred but it is difficult to coat the acetate film with such heat-fusing substance, and the viscosity of about 100 mPa.s provided a well-balanced effect in terms of coating and penetrating.

Figure 1B:
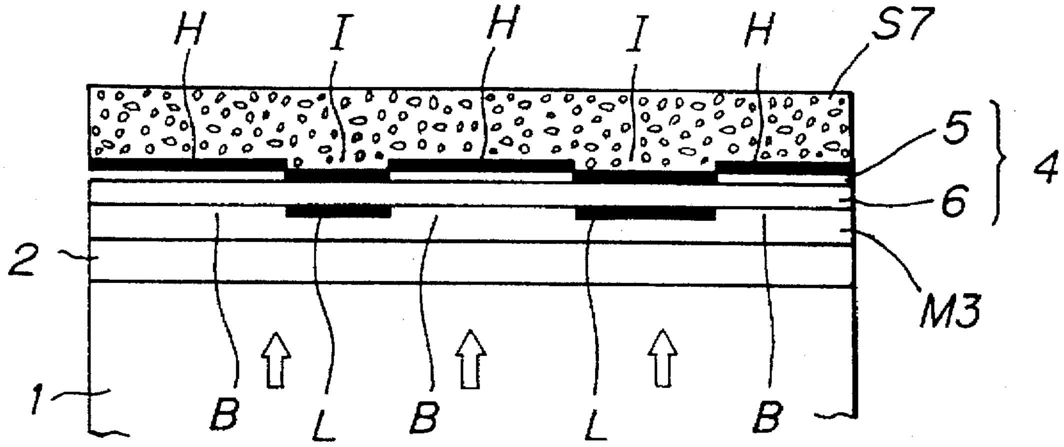
Figure 2:
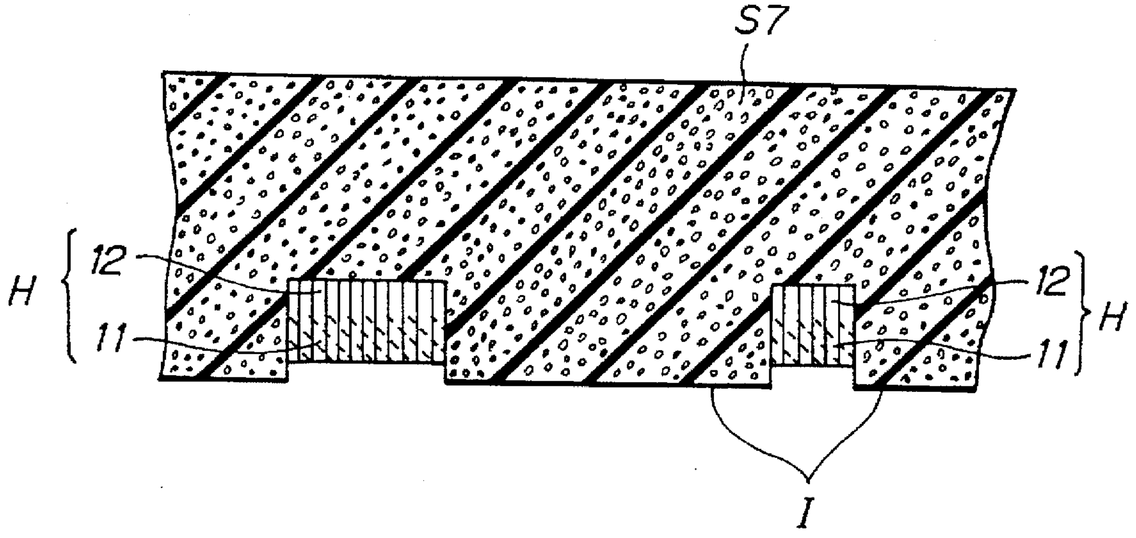
FIG. 2 is an enlarged sectional view of the stamp ink-non-oozing part (the penetrating molten part) [comprising the penetrating molten-mixing part (a part where the heat-fusing substance-penetrating part and the stamp material molten part are present together) and the stamp material molten part] and the stamp ink-oozing part (the non-molten part).

Next, a flash was applied in the state that pressure was exerted so that an elastic deformation was given to the stamp material S7 by about 50% in a thickness direction. As shown in FIG. 1(*b*), in the case where the exothermally fusible sheet 4 provided thereon with the heat-fusing substance was used, the surface of the above stamp material S7 corresponding to the impress copy image L on the impress image copy M3 became a non-molten part I and remained as a mirror image on the surface. The other surface melted on the surface of the above stamp material S7 by the heat generation of the heat-fusing substance to form a penetrating molten part H, and at the same time, the heat-fusing substance melted the stamp material, so that cells were blocked. The cells were blocked more firmly by the penetration of the heat-fusing substance [refer to FIG. 2].

The cells are compressed since the stamp material is compressed, so that the heat-fusing substance penetrates into the surface of the stamp material sheet in the state that the stamp material itself become tight, and at the same time, the above heat generation melts and blocks the open cells in plural layers.

When the thickness of the heat-fusing substance 5 provided on the exothermally fusible sheet 4 described above was 2 to 5μ, an energy efficiency in irradiating with a flash was high, and the impress image was sharp in stamping.

However, a saving effect of a flash irradiating energy can be observed even with the thickness of about 0.5μ as compared with the case where the heat-fusing substance 5 coated on the exothermally fusible sheet 4 is not the heat-fusing substance 5. On the other hand, even if the thickness thereof is increased to about 10μ, a stamping plate can be produced. In such case, however, a larger flash irradiating energy is required, and the stamp material has to be compressed furthermore in order to provide a suitable level difference on the printing face.

What is claimed is:

1. A process of producing an ink-oozing plate for a stamp, comprising:

superposing an exothermally fusible sheet comprising an infrared ray-transmittable film coated thereon with a heat-fusing substance which is heated by irradiating with infrared rays to melt at temperatures higher than a melt temperature of an elastic resin-made stamp material having stamp ink-impregnable open cells, to a thickness of 0.5 to 10μ, on the surface of the stamp material so that the above heat-fusing substance contacts the surface of the stamp material;

superposing thereon a desired impress image copy so that it becomes a mirror image;

irradiating with a flash containing infrared rays from the upper part of the copy while compressing the stamp material by 5 to 70% to allow the infrared rays to be transmitted through a copy image-absent part on the impress image copy and cause the infrared rays reaching the exothermally fusible sheet to heat and melt the heat-fusing substance present on a part corresponding to said copy image-absent part;

causing this heated heat-fusing substance to penetrate into the stamp material and melt the surface of the stamp material to form a penetrating molten part (a stamp ink-non-oozing part) where the open cells are blocked, and allowing the copy image part of the impress image copy to cut off or absorb the infrared rays to cause no heat-fusing substance present on the part of the exothermally fusible sheet corresponding thereto to be heated and molten, which does not lead to blocking the cells present on the surface of the corresponding stamp material, to form a non-molten part (a stamp ink-oozing part) to thereby form a concave part in which the penetrating molten part is lower by 0.01 mm or more than the non-molten part of the stamp material.

2. A process of producing an ink-oozing plate for a stamp as described in claim 1, wherein the stamp material is a sheet with a thickness of 0.5 to 30 mm comprising polyolefin series foam in which the melt temperature is 50° to 150° C. and which has fine open cells having a cross-linked network structure and an average pore diameter of 2 to 10μ, and a porosity of 30 to 80%; and the exothermally fusible sheet is prepared by coating an infrared ray-transmittable sheet with the heat-fusing substance containing at least carbon or a high polymer and having a melt temperature of 50° to 200° C. and a melt viscosity of 50 to 2000 mPa.s.

3. A process of producing an ink-oozing plate for a stamp as described in claim 1, wherein the impress image copy is coated with a liquid substance.

* * * * *